(12) United States Patent
Desmedt et al.

(10) Patent No.: US 7,020,312 B2
(45) Date of Patent: Mar. 28, 2006

(54) METHOD OF DETERMINING AT LEAST ONE CONTOUR OF A LEFT AND/OR RIGHT VENTRICLE OF A HEART

(75) Inventors: Paul Antoon Cyriel Desmedt, Eindhoven (NL); Henk Cornelis Willem Donker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 574 days.

(21) Appl. No.: 10/217,596

(22) Filed: Aug. 9, 2002

(65) Prior Publication Data

US 2003/0093137 A1 May 15, 2003

(30) Foreign Application Priority Data

Sep. 8, 2001 (EP) ................................ 01203030

(51) Int. Cl.
*G06K 9/00* (2006.01)
(52) U.S. Cl. ...................... 382/128; 382/199; 382/266; 600/410
(58) Field of Classification Search ................ 382/128, 382/131, 130, 169, 171, 172, 199, 278, 286, 382/289, 164, 173, 195, 143, 266, 178; 128/922; 356/39; 377/10; 600/410
See application file for complete search history.

(56) References Cited

U.S. PATENT DOCUMENTS

| | | | | |
|---|---|---|---|---|
| 4,339,799 A | * | 7/1982 | Abele et al. ................... 378/11 |
| 5,107,838 A | | 4/1992 | Yamaguchi |
| 5,457,754 A | * | 10/1995 | Han et al. ..................... 382/128 |
| 5,467,380 A | * | 11/1995 | De Jonge et al. .......... 378/98.2 |
| 5,570,430 A | * | 10/1996 | Sheehan et al. ............. 382/128 |
| 5,734,739 A | * | 3/1998 | Sheehan et al. ............. 382/128 |
| 6,106,466 A | * | 8/2000 | Sheehan et al. ............. 600/443 |
| 6,115,486 A | * | 9/2000 | Cantoni ...................... 382/128 |
| 6,549,646 B1 | * | 4/2003 | Yeh et al. .................... 382/132 |
| 6,673,018 B1 | * | 1/2004 | Friedman .................... 600/440 |

(Continued)

FOREIGN PATENT DOCUMENTS

EP A-0 521 559 1/1993

(Continued)

*Primary Examiner*—Barry Choobin
(74) *Attorney, Agent, or Firm*—Thomas M. Lundin

(57) ABSTRACT

The invention relates to a method of determining at least one contour of a left and/or right ventricle of a heart from at least one image of the heart, for example, an image as acquired by means of MR imaging, in which there are determined start parameters which are subsequently optimized by means of an iteration procedure so as to form final parameters which define the contour, the iteration being carried out with predetermined step sizes for the parameters as well as with a predetermined number of steps, where in each iteration step and for each parameter setting individually:

Figure 1:
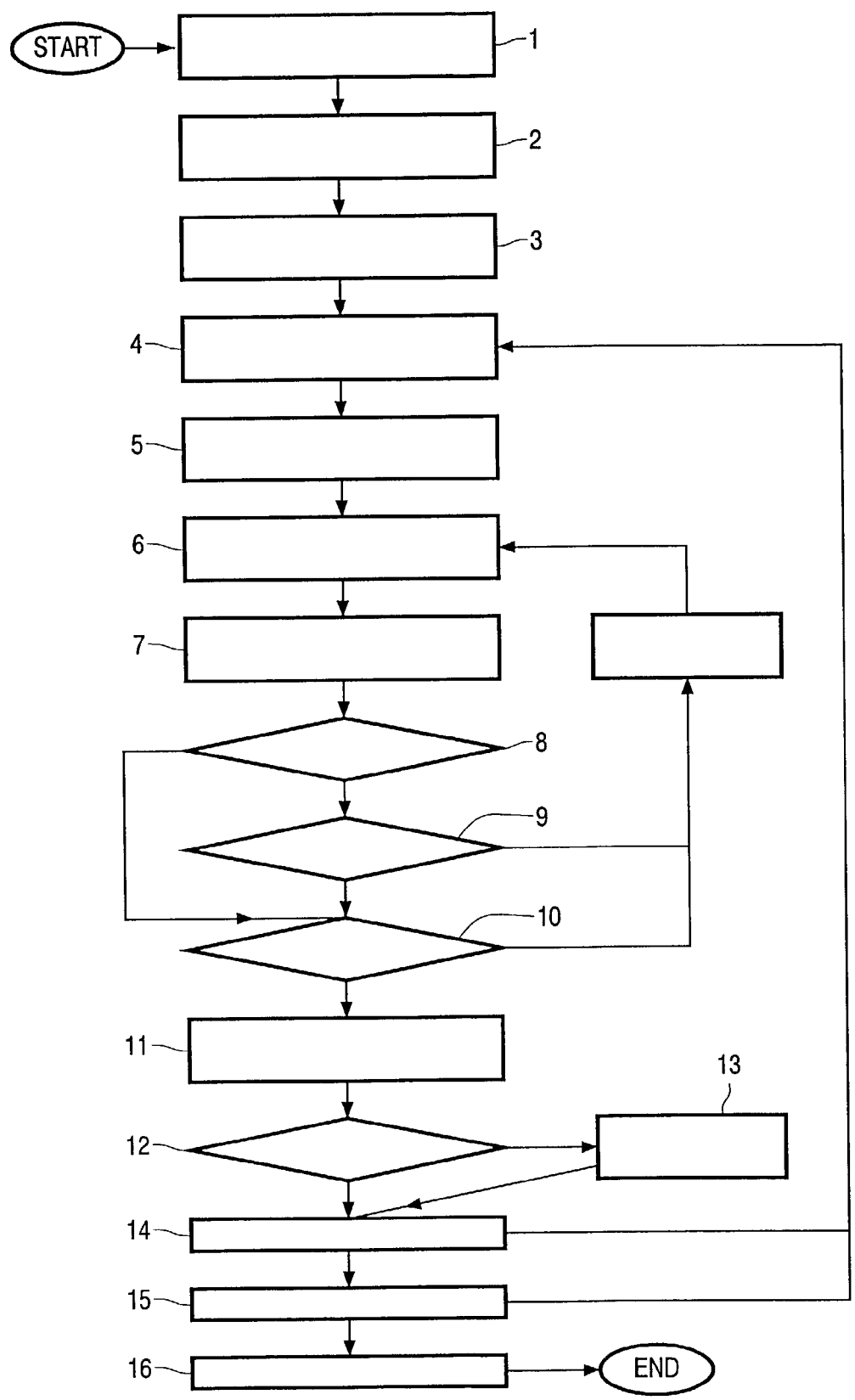

grey values of the image are determined at a predetermined side of the contour so as to provide a first reference image;

the first reference image is processed so as to form a second reference image in which a uniform grey value which is derived from a grey value from the first reference image is taken up at the predetermined side of the contour;

the first and the second reference image are correlated so as to provide a parameter correlation value and, when the latter correlation value has been improved relative to the parameter correlation value associated with a preceding iteration step, the parameters associated with the improved parameter correlation value are selected as a basis for the next iteration step, the final iteration step yielding the final parameters which define the contour.

7 Claims, 2 Drawing Sheets

U.S. PATENT DOCUMENTS

| | | | |
|---|---|---|---|
| 6,771,803 B1* | 8/2004 | Turek et al. | 382/131 |
| 6,788,827 B1* | 9/2004 | Makram-Ebeid | 382/276 |
| 6,932,767 B1* | 8/2005 | Landry et al. | 600/437 |
| 6,934,407 B1* | 8/2005 | Allouche | 382/128 |
| 6,961,454 B1* | 11/2005 | Jolly | 382/131 |
| 2002/0007117 A1* | 1/2002 | Ebadollahi et al. | 600/437 |
| 2003/0035573 A1* | 2/2003 | Duta et al. | 382/128 |
| 2003/0038802 A1* | 2/2003 | Johnson et al. | 345/420 |
| 2003/0045796 A1* | 3/2003 | Friedman | 600/450 |
| 2003/0053667 A1* | 3/2003 | Paragios et al. | 382/128 |
| 2003/0093137 A1* | 5/2003 | Desmedt et al. | 607/122 |
| 2003/0198372 A1* | 10/2003 | Touzawa et al. | 382/128 |
| 2004/0051680 A1* | 3/2004 | Azuma et al. | 345/8 |
| 2004/0106960 A1* | 6/2004 | Siejko et al. | 607/17 |
| 2004/0106961 A1* | 6/2004 | Siejko et al. | 607/17 |
| 2004/0109592 A1* | 6/2004 | Bankman et al. | 382/128 |
| 2004/0153128 A1* | 8/2004 | Suresh et al. | 607/14 |
| 2005/0018890 A1* | 1/2005 | McDonald et al. | 382/128 |

FOREIGN PATENT DOCUMENTS

| | | |
|---|---|---|
| WO | WO 01/29770 A2 | 4/2001 |

* cited by examiner

METHOD OF DETERMINING AT LEAST ONE CONTOUR OF A LEFT AND/OR RIGHT VENTRICLE OF A HEART

BACKGROUND

The invention relates to a method of determining at least one contour of a left and/or right ventricle of a heart from at least one image of the heart, for example, an image as acquired by means of MR imaging, in which there are determined start parameters which are subsequently optimized by means of an iteration procedure so as to form final parameters which define the contour.

A method of this kind is known from European patent application EP-A-0 521 559. In conformity with the known method MR images are processed in such a manner that the contours of a beating heart can be followed. A previously determined contour is then used each time as the starting point for the determination of the contour in a subsequent image.

SUMMARY

It is an object of the invention to provide a method of the kind set forth in which the determination of the contours of a left ventricle and/or a right ventricle of a heart can be performed fully automatically. This is because according to the present state of the art it is still necessary to enter at least the starting contour by hand.

The method in accordance with the invention is characterized in that the iteration is performed with predetermined step sizes for the parameters as well as with a predetermined number of steps, where in each iteration step and for each parameter setting individually:

grey values of the image are determined at a predetermined side of the contour so as to provide a first reference image, the first reference image is processed so as to form a second reference image in which a uniform grey value which is derived from a grey value from the first reference image is taken up at the predetermined side of the contour, the first and the second reference image are correlated so as to provide a parameter correlation value and, when the latter correlation value has been improved relative to the parameter correlation value associated with a preceding iteration step, the parameters associated with said improved parameter correlation value are selected as a basis for the next iteration step, the final iteration step yielding the final parameters which define the contour.

In a preferred version of the method in accordance with the invention the reference image is preferably correlated with its mirror image so as to provide a correlation value which is indicative of the circular symmetry of the first reference image, correlation of the first and the second reference image being omitted when this correlation value is below a predetermined limit value, and the iteration step in that case being continued with a next parameter setting. This is because the method in accordance with the invention is based on the recognition of the fact that at least the endocardium of the left ventricle of the heart can be suitably approximated by a circular contour in which a limited variation of grey values occurs. A substantial deviation of the first reference image therefrom thus forms an indication that the relevant fit of the image is not in conformity with this starting point, and hence is not optimum.

For a satisfactory execution of the fully automatic determination of the contours of the heart it is desirable that a first and a second circular contour which bound the myocardium of the left ventricle of the heart are determined during the determination of the left ventricle of the heart.

In this context the first circular contour preferably models the endocardium of the heart and has an initial radius of approximately 25 mm, and the second circular contour preferably models the epicardium of the heart and has an initial radius of approximately 35 mm.

In conformity with a further aspect of the invention, it is desirable that one circular contour whose situation is defined relative to a predetermined situation of the left ventricle is determined during the determination of the right ventricle of the heart.

The invention also relates to a workstation suitable for carrying out the method of the invention. The workstation, for example, comprises circuitry that is designed to carry out the steps of the method of the invention. The invention also relates to a computer program for carrying out the method of the invention. The computer program of the invention can be loaded into the working memory of the workstation so as to suitably program the workstation to allow the workstation to carry out the method of the invention. The computer program of the invention may be stored on a data carrier such as a CD-rom or may be downloaded from a data network such as the world-wide web.

The invention will be described in detail hereinafter with reference to a version which indicates the best form in which the invention can be used. However, the invention is not restricted to this specific version.

DRAWINGS

Figure 2:
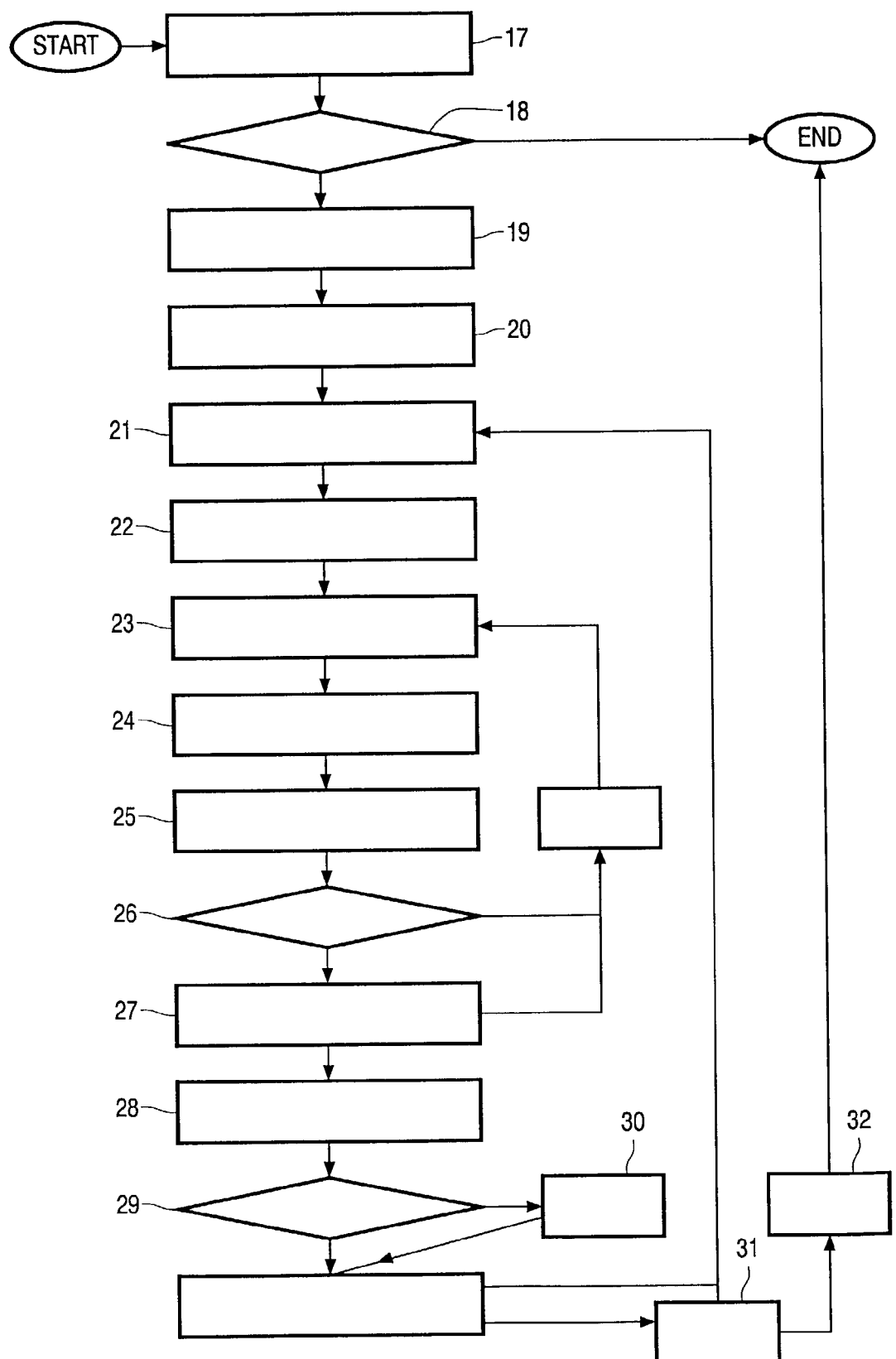

The version in accordance with the invention will be described in detail hereinafter with reference to the drawing, in which FIG. 1 shows a flow chart for determining the contours of the left ventricle, and FIG. 2 shows a flow chart for determining the contours of the right ventricle of the heart.

DESCRIPTION

Referring to FIG. 1, the method of determining the contour of the left ventricle will be explained first.

The execution of the method starts with images, that is, at least one image as may have been acquired, for example, by means of MR imaging (see the reference numeral 1). During a subsequent step 2, start contours are determined; such start contours have a circular shape and are positioned approximately at the center of the image provided in the block 1. A first contour, corresponding to the endocardium, is started with a radius value of approximately 25 mm whereas the second contour is started with a radius value of approximately 35 mm. In the block 3 the iteration procedure commences with the above parameters which are decisive as regards the situation of the first and the second contour. These parameters are the center of the two circles and also their respective radii. For these parameters a series of ascending and descending step sizes is determined so as to execute the iteration procedure.

In the block 4 of this procedure it is checked each time whether the parameters satisfy predetermined probability criteria. If this is the case, the associated grey values within the two contours which determine the endocardium and the epicardium of the left ventricle are determined for the relevant parameters in the block 6, that is, for the position of the center and the radii of the circular contours as determined in the block 5. Subsequently, in the block 7 a second reference image is derived from the first reference image determined in the block 6. In the second reference image a distinction is made between the region which is situated within the first contour (the endocardium) and the region which is situated between the endocardium and the epicardium and hence constitutes the myocardium of the heart. The second reference image as produced by the block 7 is composed in such a manner that uniform grey values are taken up on both sides of the contour which determines the endocardium.

When the step size of the variation of the parameters is descending (which is checked in the block 8), in the block 9 subsequently a correlation takes place between the first reference image (provided by the block 6) and its mirror image. When the correlation value then determined is lower than a predetermined limit value, the correlation of the first and the second reference image as discussed hereinafter is omitted and the iteration is continued with a subsequent parameter setting and an associated determination of a new first reference image in the function block 6. When the correlation value determined in the function block 9 is sufficiently high, in the function block 10 the first reference image from the function block 6 is subsequently correlated with the second reference image from the function block 7.

In the function block 11 the correlation values associated with the varied parameters relating to the two circular contours are grouped in a descending order, it being checked in the function block 12 whether the correlation just performed has yielded a value which is higher than that yielded by the correlation calculation in a preceding iteration step. If this is the case, the associated parameters are stored in the block 13. In the function block 14 it is checked whether the improvement thus achieved is large enough. If the difference between successive correlation coefficients is comparatively small, the iteration is continued (as indicated in the function block 15) with a next iteration step with the associated step size. In the function block 16 it is indicated that, after all predetermined step sizes have been executed, the result of the iteration step with the highest correlation yields the final parameters which determine the two contours of the left ventricle.

FIG. 2 shows the method in accordance with the invention as used for the determination of the right ventricle of the heart. The function block 17 utilizes the image as acquired, for example, by means of MR imaging, is used as a basis. Subsequently, in the function block 18 it is first checked whether the contours of the left ventricle have already been determined. The method is continued only if this is the case; a start is then made with a few points of departure which are decisive as regards the image analysis of the right ventricle. The right ventricle inter alia should be situated next to the left ventricle and in the same vicinity as the left ventricle. The right ventricle, moreover, exhibits a mainly homogeneous signal intensity. Subsequently, the step sizes for the execution of the iteration for the determination of the contour of the right ventricle are determined in the function block 20. Subsequently, in the function block 21 first a test is performed as regards the parameters which determine the contours of the right ventricle. These parameters determine the situation of the right ventricle relative to the distance between the center of the (circular) contour and the center of the contours of the left ventricle, and also the direction thereof and the radius of the contour of the right ventricle. These parameters are varied in the function block 22, yielding a corresponding contour of the right ventricle in the block 23. In the function block 24 the grey values which are present within the contour of the right ventricle are determined. This yields a first reference image. In the function block 25 the first reference image is processed so as to form a second reference image, all grey values within said second reference image having a uniform value which is derived from a grey value from the first reference image. In the function block 26 it is checked whether the first reference image, yielded by the function block 24, satisfies the condition as regards mirror symmetry. If this is not the case, the iteration step is interrupted and the process continues with the determination of a next parameter setting with which the iteration can be continued. When the condition as regards mirror symmetry is satisfied, the correlation between the first reference image and the second reference image is carried out in the function block 27, the correlation values associated with the various varied parameters being placed in order again in the function block 28. Subsequently, in the function block 29 it is checked whether the correlation value of the last iteration step executed offers an improvement in comparison with the preceding iteration step. If this is the case, the associated parameters are stored in the function block 30. Subsequently, the procedure can be continued by carrying out a next iteration step (see block 31). When all iteration steps have been carried out, from the parameters then obtained the function block 32 extracts the contour which defines the right ventricle.

The resultant contours of the left ventricle and right ventricle can be formed into the final image, in a manner which is known to those skilled in the art, by making the image grow outside the defined contours with grey values from the original image which are within predetermined limit values.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of determining at least one contour of a left and/or right ventricle of a heart from at least one image of the heart, in which there are determined start parameters which are subsequently optimized by means of an iteration procedure so as to form final parameters which define the contour, characterized in that the iteration is performed with predetermined step sizes for the parameters as well as with a predetermined number of steps, where in each iteration step and for each parameter setting individually:

grey values of the image are determined at a predetermined side of the contour so as to provide a first reference image;

the first reference image is processed so as to form a second reference image in which a uniform grey value which is derived from a grey value from the first reference image is taken up at the predetermined side of the contour;

the first and the second reference image are correlated so as to provide a parameter correlation value and, when the latter correlation value has been improved relative to the parameter correlation value associated with a preceding iteration step, the parameters associated said improved parameter correlation value are selected as a basis for the next iteration step, the final iteration step yielding the final parameters which define the contour.

2. A method as claimed in claim 1, characterized in that the first reference image is correlated with its mirror image so as to provide a correlation value which is indicative of the circular symmetry of the first reference image, correlation of the first and the second reference image being omitted when this correlation value is below a predetermined limit value, and the iteration step in that case being continued with a next parameter setting.

3. A method as claimed in claim 1, characterized in that during the determination of the left ventricle of the heart a first and a second circular contour are determined which bound the myocardium of the left ventricle of the heart.

4. A method as claimed in claim 3, characterized in that the first circular contour models the endocardium of the heart and has an initial radius of approximately 25 mm.

5. A method as claimed in claim 3, characterized in that the second circular contour models the epicardium of the heart and has an initial radius of approximately 35 mm.

6. A method as claimed in claim 1, characterized in that upon determination of the right ventricle of the heart there is determined one circular contour whose situation is determined relative to a predetermined situation of the left ventricle.

7. A method as claimed in claim 1 wherein the at least one image of the heart is an image acquired by means of MR imaging.

* * * * *